US012690292B2

(12) United States Patent　(10) Patent No.:　US 12,690,292 B2
Zhang et al.　(45) Date of Patent:　Jul. 21, 2026

(54) SOLAR CELL AND TANDEM SOLAR CELL

(71) Applicant: ZHEJIANG JINKO SOLAR CO., LTD., Haining (CN)

(72) Inventors: Bike Zhang, Haining (CN); Xinyu Zhang, Haining (CN); Bo Zhang, Haining (CN); Jingsheng Jin, Haining (CN); Ran Ning, Haining (CN); Lianhu Xu, Haining (CN); Changming Liu, Haining (CN)

(73) Assignee: Zhejiang Jinko Solar Co., Ltd., Haining (CN)

( * ) Notice: Subject to any disclaimer, the term of this patent is extended or adjusted under 35 U.S.C. 154(b) by 0 days.

(21) Appl. No.: 19/232,587

(22) Filed: Jun. 9, 2025

(65) Prior Publication Data

US 2025/0380534 A1　Dec. 11, 2025

(30) Foreign Application Priority Data

Jun. 11, 2024　(CN) ......................... 202410748886.1

(51) Int. Cl.
*H10F 77/30*　(2025.01)
*H10F 77/20*　(2025.01)
*H10F 77/70*　(2025.01)

(52) U.S. Cl.
CPC .......... *H10F 77/311* (2025.01); *H10F 77/211* (2025.01); *H10F 77/315* (2025.01); *H10F 77/703* (2025.01)

(58) Field of Classification Search
CPC .... H10F 77/211; H10F 77/311; H10F 77/315; H10F 77/703
See application file for complete search history.

(56) References Cited

U.S. PATENT DOCUMENTS

2020/0135944 A1* 4/2020 Yi ........................... H10F 10/14

FOREIGN PATENT DOCUMENTS

AU 　2023201866 B1 　5/2024
CN 　　104409571 A * 3/2015 ........... H10F 71/137
(Continued)

OTHER PUBLICATIONS

Machine translation of CN-104409571-A, Guo, Wen-Jin. (Year: 2015).*

(Continued)

*Primary Examiner* — Mayla Gonzalez Ramos
(74) *Attorney, Agent, or Firm* — Knobbe, Martens, Olson & Bear, LLP

(57) ABSTRACT

Provided are a solar cell and a tandem solar cell. The solar cell includes a substrate, a tunnel dielectric layer, a doped conductive layer, a first passivation layer and a first electrode. A first surface of the substrate includes metal regions having a first texture structure including a first recess, and non-metal regions having a second texture structure including a second recess. A one-dimensional size of a bottom surface of the first recess is smaller than that of the second recess. The tunnel dielectric layer is arranged at the first texture structure. The doped conductive layer is arranged at a side of the tunnel dielectric layer. The first passivation layer is arranged at a side of the doped conductive layer and at the second texture structure. The first passivation layer includes a third region and a fourth region. The first electrode is electrically connected to the doped conductive layer.

20 Claims, 10 Drawing Sheets

(56)              References Cited

FOREIGN PATENT DOCUMENTS

| | | | | |
|----|----|----|----|----|
| CN | 110610998 A | * | 12/2019 | ........... H10F 71/129 |
| NL | 2034509 A | | 3/2024 | |
| WO | WO-2013161373 A1 | * | 10/2013 | ........... H10F 77/215 |

OTHER PUBLICATIONS

Machine translation of CN 110610998 A, Zhang, Shu-de. (Year: 2019).*

European Search Report issued in corresponding EP Application 25180996.8, issued Oct. 28, 2025 (9 pages).

* cited by examiner (a)          (b)          (c)

SOLAR CELL AND TANDEM SOLAR CELL

CROSS-REFERENCE TO RELATED APPLICATIONS

The present application claims priority to Chinese patent application No. 202410748886.1 filed on Jun. 11, 2024, the content of which is incorporated herein by reference in its entirety.

TECHNICAL FIELD

The present disclosure relates to the technical field of photovoltaic cells and, in particular, to a solar cell and a tandem solar cell.

BACKGROUND

A solar cell is a photoelectric semiconductor plate that directly generates electricity by using sunlight, and is also called "solar chip" or "photocell", which can output a voltage instantly and generate a current in a circuit when being illuminated by light that meets a certain illumination condition.

At present, in order to reduce the cost of the solar cell, a thickness of a silicon wafer is continuously reduced, and photogenerated carriers are easily diffused to a surface of the solar cell to cause recombination, so that the performance of the solar cell is affected. Therefore, a passivation layer is usually formed at the surface of the solar cell to reduce a recombination rate of the surface of the solar cell. However, in order to improve the passivation effect at the surface of the solar cell, a structure of the passivation layer at the surface of the solar cell needs to be further studied.

SUMMARY

In view of this, the present disclosure provides a solar cell and a tandem solar cell, so as to facilitate the improvement of the passivation effect on a surface of the solar cell, thereby improving the photoelectric conversion efficiency of the solar cell.

In a first aspect, an embodiment of the present disclosure provides a solar cell, including a substrate, a tunnel dielectric layer, a doped conductive layer, a first passivation layer and a first electrode. A first surface of the substrate includes metal regions and non-metal regions which are distributed in an alternate manner. The metal region is provided with a first texture structure. The first texture structure includes a first recess. The non-metal region is provided with a second texture structure. The second texture structure includes a second recess. A one-dimensional size of a bottom surface of the first recess is smaller than a one-dimensional size of a bottom surface of the second recess, and the tunnel dielectric layer is arranged at a surface of the first texture structure. The doped conductive layer is arranged at a side of the tunnel dielectric layer away from the substrate. The first passivation layer is arranged at a side of the doped conductive layer away from the tunnel dielectric layer and at a surface of the second texture structure. The first passivation layer includes a third region and a fourth region. The third region is provided with a first passivation sub-layer. The first electrode is arranged at a side of the doped conductive layer away from the tunnel dielectric layer. The first electrode is electrically connected to the doped conductive layer.

In a possible implementation, a thickness of the first passivation sub-layer gradually decreases along a direction from the third region towards the fourth region.

In a possible implementation, the thickness of the first passivation sub-layer ranges from 1 nm to 5 nm.

In a possible implementation, the first passivation sub-layer is an aluminum oxide layer.

In a possible implementation, the first passivation layer further includes a second passivation sub-layer, the second passivation sub-layer is arranged in the third region and the fourth region, and the first passivation sub-layer and at least part of the second passivation sub-layer and are stacked.

In a possible implementation, the third region surrounds and is connected to a periphery of the fourth region.

In a possible implementation, the third region and the fourth region are arranged in sequence along a first direction of the solar cell.

In a possible implementation, in a thickness direction of the solar cell, a ratio of a surface area of the fourth region to a surface area of the first passivation layer is greater than 0 and smaller than or equal to 40%.

In a possible implementation, the one-dimensional size of the bottom surface of the first recess ranges from 5 μm to 10 μm, and a depth of the first recess ranges from 0.05 μm to 2 μm; and the one-dimensional size of the bottom surface of the second recess ranges from 10 μm to 25 μm, and a depth of the second recess ranges from 0.05 μm to 2 μm.

In a possible implementation, a top surface of the metal region protrudes relative to a top surface of the non-metal region in a thickness direction of the substrate.

In a possible implementation, in the thickness direction of the substrate, a height difference between the top surface of the metal region and the top surface of the non-metal region ranges from 1 μm to 10 μm.

In a possible implementation, the first surface further includes a transition region, the transition region is connected between the metal region and the non-metal region, the transition region is provided with one or more holes, a diameter of the hole ranges from 0.5 μm to 5 μm, and a depth of the hole ranges from 0.5 μm to 2 μm.

In a possible implementation, the transition region is arranged obliquely relative to the metal region and the non-metal region.

In a possible implementation, the solar cell further includes an antireflection layer arranged at a side of the first passivation layer away from the substrate.

In a second aspect, an embodiment of the present disclosure provides a tandem solar cell, including a bottom cell, a top cell and an intermediate connection layer. The bottom cell is the solar cell according to any one of the above-described embodiments. The top cell is one of a perovskite solar cell, a donor-acceptor cell, a cadmium telluride solar cell, a copper indium gallium selenide solar cell or a gallium arsenide solar cell. The intermediate connection layer is connected between the bottom cell and the top cell.

In a third aspect, an embodiment of the present disclosure provides a photovoltaic module, including a solar cell string, an encapsulation layer and a cover plate. The solar cell string is formed by connecting a plurality of solar cells according to any one of the above-described embodiments. The encapsulation layer is configured to cover a surface of the solar cell string, and the cover plate is configured to cover a surface of the encapsulation layer away from the solar cell string.

It is to be understood that both the foregoing general description and the following detailed description are exemplary only and are not intended to limit the present disclosure.

BRIEF DESCRIPTION OF DRAWINGS

To better describe the technical solutions in embodiments of the present disclosure, the following briefly describes the accompanying drawings required for the embodiments. Apparently, the accompanying drawings in the following description show merely some embodiments of the present disclosure, and a person of ordinary skill in the art may still derive other drawings from these accompanying drawings without creative efforts.

REFERENCE SIGNS

Figure 1:
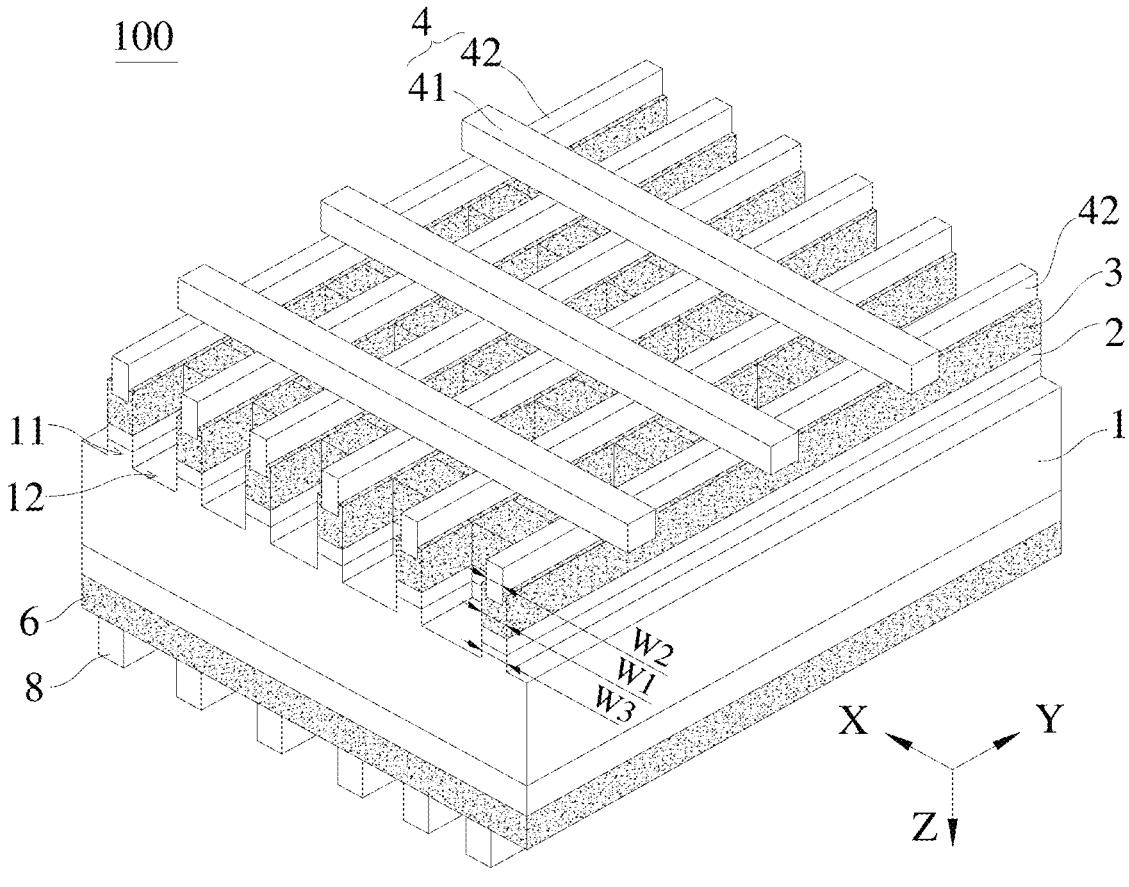
FIG. 1 is a schematic structural diagram of a solar cell according to one or more embodiments of the present disclosure.

100—solar cell;
1—substrate;
11—metal region;
111—first texture structure;
111a—first recess;
112—first region;
113—second region;
12—non-metal region;
121—second texture structure;
121a—second recess;
13—transition region;
131—hole;
1a—first surface;
1b—second surface;
2—tunnel dielectric layer;
3—doped conductive layer;
4—first electrode;
41—bus electrode;
42—finger electrode;
5—first passivation layer;
51—third region;
52—fourth region;
53—first passivation sub-layer;
54—second passivation sub-layer;
6—emitter;
7—second passivation layer;
8—second electrode;
9—antireflection layer;
110—solar cell string;
120—encapsulation layer;
130—cover plate;
140—top cell;
150—intermediate connection layer;
X—first direction;
Y—second direction;
Z—thickness direction.

The accompanying drawings, which are incorporated in and constitute a part of the specification, illustrate embodiments consistent with the present disclosure and, together with the specification, serve to explain the principles of the present disclosure.

DESCRIPTION OF EMBODIMENTS

In order to better illustrate the technical solutions of the present disclosure, embodiments of the present disclosure are described in detail below with reference to the accompanying drawings.

In the description of the present disclosure, unless explicitly specified and limited otherwise, the terms "first" and "second" are used for descriptive purposes only and are not to be construed as indicating or implying relative importance. The term "multiple/plurality" means two or more unless specified or explained otherwise. The terms "connection", "fixation", or the like, are to be construed broadly, and "connection" may be, for example, fixed connection, detachable connection, integral connection or electrical connection; or may indicate direct connection or indirect connection via an intermediate. For those of ordinary skill in the art, the specific meanings of the above-mentioned terms in the present disclosure can be understood on case-by-case.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be noted that, the expressions such as "upper", "lower", "left", "right" and the like mentioned in embodiments of the present disclosure are described with reference to the placement status in the accompanying drawings, and should not be construed as limiting embodiments of the present disclosure. In addition, it should also be understood that, in the context, while referring to an element being formed "above" or "below" another element, it is possible that the element is directly formed "above" or "below" the other element, it is also possible that the element is formed "above" or "below" the other element via an intermediate element.

A solar cell is a photoelectric semiconductor plate that directly generates electricity by using sunlight, and is also called "solar chip" or "photocell", which can output a voltage instantly and generate a current in a circuit when being illuminated by light that meets a certain illumination condition.

At present, in order to reduce the cost of the solar cell, a thickness of a silicon wafer is continuously reduced, and photogenerated carriers are easily diffused to a surface of the solar cell to cause recombination, so that the performance of the solar cell is affected. Therefore, a passivation layer is usually formed at the surface of the solar cell to reduce the recombination rate of the surface of the solar cell. However, in order to improve the passivation effect at the surface of the solar cell, a structure of the passivation layer at the surface of the solar cell needs to be further studied.

Based on this, the present disclosure provides a solar cell, a tandem solar cell and a photovoltaic module, so as to facilitate improving the photoelectric conversion efficiency of the solar cell. The solar cell can be applied to various solar cell structures, including but not limited to a tunnel oxide passivated contact (TOPCon) cell, an interdigitated back contact (IBC) cell, a passivated emitter rear cell (PERC), or the like, no limitation is made herein.

For the sake of easy understanding, for example, the following description will be given as an example with the solar cell being a TOPCon cell.

As shown in FIG. 1, the solar cell 100 includes a substrate 1, a tunnel dielectric layer 2, a doped conductive layer 3, a first passivation layer 5, and a first electrode 4.

Figure 2:
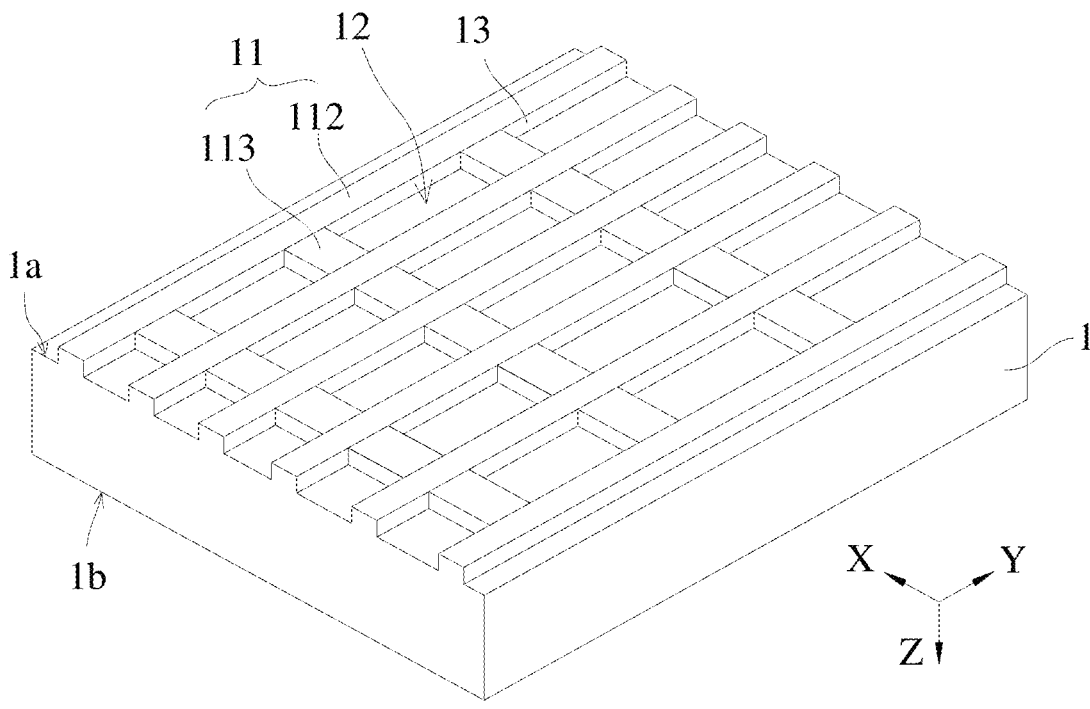
FIG. 2 is a schematic structural diagram of a substrate of a solar cell according to one or more embodiments of the present disclosure.

As shown in FIG. 2, the substrate 1 is configured to receive incident light and generate photogenerated carriers. In some embodiments, the substrate 1 is a silicon substrate which may include one or more of monocrystalline silicon, polycrystalline silicon, amorphous silicon, or microcrystalline silicon. In some other embodiments, the material of the substrate 1 may also be silicon carbide, an organic material or a multi-component compound. The multi-component compound may include, but is not limited to, perovskite, gallium arsenide, cadmium telluride, copper indium selenide, or the like. For example, the substrate 1 may be a monocrystalline silicon substrate. The substrate 1 includes a doped element, the conductivity type of the doped element may be N-type or P-type, the N-type element may be a group-V element, such as phosphorus (P), bismuth (Bi), antimony (Sb), or arsenic (As); and the P-type element may be a group-III element, such as boron (B), aluminum (Al), gallium (Ga), or indium (In). In an example, in a case that the substrate 1 is a P-type silicon substrate, the conductivity type of the doped element therein is P-type. In another example, in a case that the substrate 1 is an N-type silicon substrate, the conductivity type of the doped element therein is N-type. For example, in some embodiments of the present disclosure, the substrate 1 is an N-type silicon substrate, so as to improve the conversion efficiency of the solar cell 100 and reduce the manufacturing cost.

As shown in FIG. 2 to FIG. 5, the substrate 1 includes a first surface 1a (for example, backlight surface) and a second surface 1b (for example, light receiving surface) which are arranged opposite to each other, and the first surface 1a includes metal regions 11 and non-metal regions 12 which are distributed in an alternate manner. Herein, the metal region and the non-metal region are functional regions roughly defined according to a surface metallization treatment. The metal region is a region on the battery surface where an electrode or a conductive structure is formed by metallization process (such as screen printing, electroplating, evaporation, etc.), and the non-metal region is a region on the battery surface other than the metal region. An area of the metal region does not completely correspond to an area of a gate line, and the area of the metal region is usually larger than that of the gate line. The metal region 11 is provided with a first texture structure 111, and the first texture structure 111 includes a first recess 111a. The non-metal region 12 is provided with a second texture structure 121, and the second texture structure 121 includes a second recess 121a. A one-dimensional size of a bottom surface of the first recess 111a is smaller than that of a bottom surface of the second recess 121a.

It should be noted that, in some embodiments of the present disclosure, a laser or chemical etching method may be used to form the first texture structure 111 at the metal region 11 of the first surface 1a and form the second texture structure at the non-metal region 12. The one-dimensional size of the bottom surface of the first recess 111a and the one-dimensional size of the bottom surface of the second recess 121a may be, for example, a length, a width, a diagonal length, a circle diameter, or the like, of the surface, no limitation is made herein. In some examples, calibrations on a film surface may be measured directly by a test instrument (optical microscope, atomic force microscope, scanning electron microscope, transmission electron microscope, or the like) when measuring a one-dimensional size of a top surface of a non-pyramidal texture structure.

Figure 5:
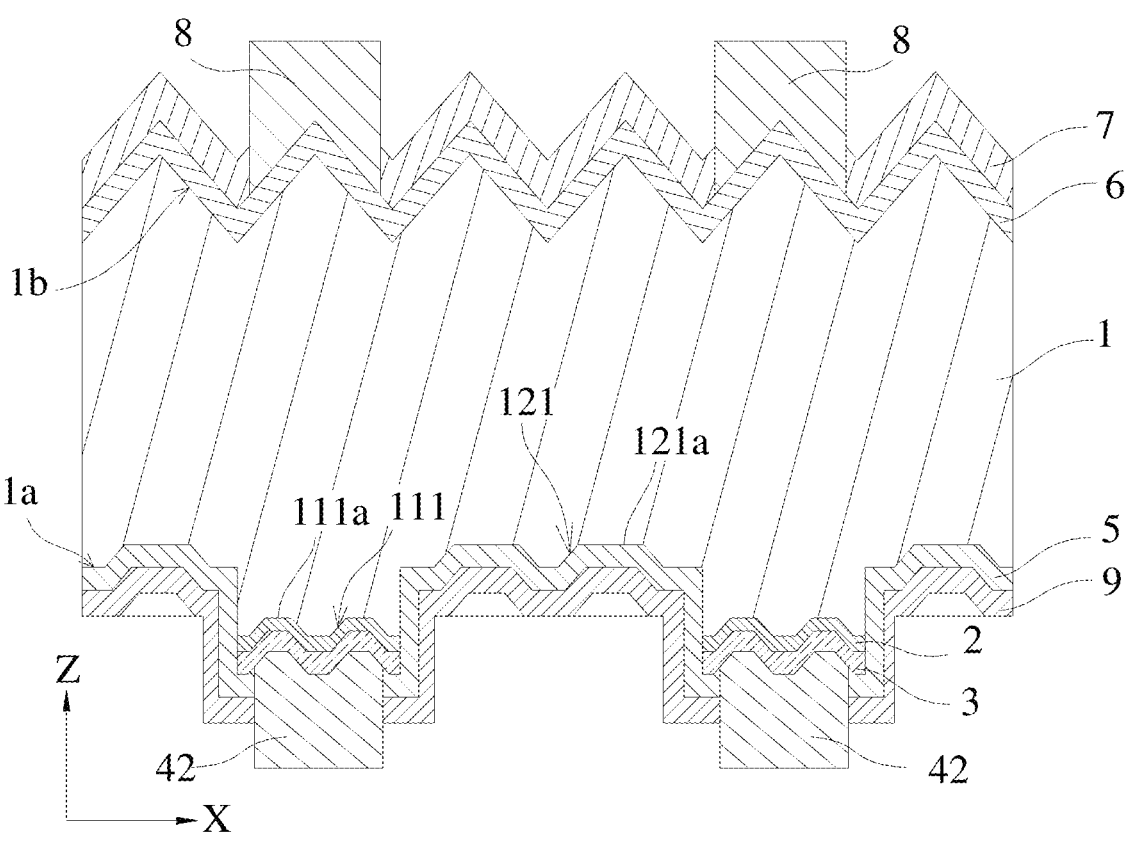
FIG. 5 is a sectional view of the solar cell in FIG. 4 taken along A-A.

As shown in FIG. 1 and FIG. 5, the tunnel dielectric layer 2 is arranged at a surface of the first texture structure 111. The tunnel dielectric layer 2 reduces an interface state density between the substrate 1 and the doped conductive layer 3 by chemical passivation, and reduces recombination of minority carriers and holes, and improves the passivation effect at the first surface 1a of the substrate. The tunnel dielectric layer 2 can enable majority carriers to tunnel into the doped conductive layer 3, and then, the majority carriers are transversely transmitted in the doped conductive layer 3, thereby facilitating the collection of the carriers by the first electrode 4, and facilitating the increase of the open-circuit voltage and the short-circuit current of the solar cell 100.

The tunnel dielectric layer 2 may have a single-layer or tandem structure made of one or more of dielectric materials with a tunnel effect, such as silicon oxide, silicon nitride, silicon oxynitride, nanocrystalline silicon, intrinsic amorphous silicon, intrinsic polycrystalline silicon, or the like. In other embodiments, the tunnel dielectric layer 2 may also be a silicon nitride layer containing oxygen, a silicon carbide layer containing oxygen, or the like. For example, the tunnel dielectric layer 2 may be an ultra-thin silicon oxide layer, so that the tunnel dielectric layer 2 has a good passivation characteristic, and the carriers can more easily tunnel. A thickness of the tunnel dielectric layer 2 may generally range from 1 nm to 2 nm, may be specifically set according to actual requirements, and is not limited herein. In some possible implementations, the tunnel layer may be formed at the first surface 1a side of the substrate 1 by using an ozone oxidation method, a high-temperature thermal oxidation method, a nitric acid oxidation method, a chemical vapor deposition method, or a low pressure chemical vapor deposition (LPCVD) method.

As shown in FIG. 1 and FIG. 5, the doped conductive layer 3 is arranged at a side of the tunnel dielectric layer 2 away from the substrate 1. The doped conductive layer 3 can be used as a field passivation layer, and the doped conductive layer 3 and the tunnel dielectric layer 2 jointly form a passivation contact structure, further improving the passivation effect at the surface of the substrate 1. The doped element in the doped conductive layer 3 is the same as that in the substrate 1, and a concentration difference is formed between the doped elements of the doped conductive layer and the substrate 1, so that a high-low junction is formed, the doped conductive layer 3 can be in good contact with the first electrode 4, and energy band bending can be formed at the surface of the substrate 1, thus realizing selective transmission of the carriers, and reducing the recombination loss. For example, the doped conductive layer 3 may be deposited at a surface of the tunnel dielectric layer 2 by using any one of a physical vapor deposition method, a chemical vapor deposition method, a plasma enhanced chemical vapor deposition (PECVD) method, and an atomic layer deposition method. In a thickness direction Z, a thickness of the doped conductive layer 3 may range from 100 nm to 200 nm, for example, the thickness of the doped conductive layer 3 may be 100 nm, 120 nm, 140 nm, 160 nm, 180 nm, 200 nm, or the like, which can be specifically set according to actual requirements, no limitation is made herein.

As shown in FIG. 1 and FIG. 5, the first electrode 4 is configured to collect and gather a current of the solar cell 100. The first electrode 4 is arranged at a side of the doped conductive layer 3 away from the tunnel dielectric layer 2, and the first electrode 4 and the doped conductive layer 3 can be in direct or indirect contact to each other to form an electrical connection. For example, the first electrode 4 may be formed by screen printing and sintering. In some embodiments, metal paste for forming the first electrode 4 may be one or more of aluminum, silver, gold, nickel, molybdenum, or copper, no limitation is made herein.

As shown in FIG. 5, the first passivation layers 5 are arranged at a side of the doped conductive layer 3 away from the tunnel dielectric layer 2, and at a surface of the second texture structure 121. The first passivation layer 5 can well passivate a surface of a side of the doped conductive layer 3 away from the substrate 1 and the surface of the second texture structure 121, reducing the interface state density, reducing recombination of the minority carriers, improving the transmission efficiency of the carriers at an interface, and improving the efficiency of the solar cell 100. For example, the first passivation layer 5 may be deposited by a PECVD method, or other methods, such as an organic chemical vapor deposition method. The first passivation layer 5 may be a single-layer structure, a tandem structure, or a single-layer and tandem combined structure, and a thickness of each layer can be designed correspondingly, no limitation is made herein. In some embodiments, the first passivation layer 5 may be any one or a combination of a silicon nitride layer, a silicon oxynitride layer, a silicon oxide layer, and an aluminum oxide layer. Certainly, the first passivation layer 5 may also be a passivation layer of another type, no limitation is made herein.

As shown in FIG. 6 to FIG. 10, the first passivation layer 5 includes a third region 51 and a fourth region 52, and a first passivation sub-layer 53 is provided at the third region 51.

In some embodiments, as shown in FIG. 1 to FIG. 5, the metal region 11 of the substrate 1 is a region directly facing the first electrode 4, and the non-metal region 12 is a region not directly facing the first electrode 4. A one-dimensional size of the first recess 111a at the metal region 11 for forming the first texture structure 111 is relatively small, so that a ratio of an actual surface area of the first surface 1a to a plane area of the first surface 1a in the metal region 11 is relatively large, that is, the ratio of the surface area to the plane area is relatively large, so that the areas of the tunnel dielectric layer 2, the doped conductive layer 3 and the first electrode 4 formed at the metal region 11 are increased, thus increasing the area of contact between the doped conductive layer 3 and the first electrode 4 at the metal region 11. The first recess 111a can be better filled with the metal paste for forming the first electrode 4, thereby improving the performance of metal contact between the doped conductive layer 3 and the first electrode 4. Meanwhile, a one-dimensional size of the second recess 121a at the non-metal region 12 for forming the second texture structure 121 is relatively large, so that a ratio of an actual surface area of the first surface 1a at the non-metal region 12 to a plane area of the first surface 1a at the non-metal region 12 is relatively small, that is, the ratio of the surface area to the plane area is relatively small, thereby making the first surface 1a at the non-metal region 12 more smooth, reducing recombination points at the first surface 1a at this region, reducing the recombination rate, and thus improving the surface passivation effect at the non-metal region 12, which is favorable for improving the conversion efficiency of the solar cell 100.

As shown in FIG. 1 and FIG. 5, the tunnel dielectric layer 2 and the doped conductive layer 3 are only arranged in the metal region 11, so that the performance of metal contact with the first electrode 4 can be improved, and the transmission of the carriers is facilitated. Light parasitic absorption on the surface of the non-metal region 12 can be reduced by arranging no tunnel dielectric layer 2 and no doped conductive layer 3 in the non-metal region 12.

In addition, as shown in FIG. 5 to FIG. 10, if the third region 51 and the fourth region 52 each are provided with a first passivation sub-layer 53, that is, the first passivation sub-layer 53 is provided at each position of a side of the doped conductive layer 3 away from the tunnel dielectric layer 2, the first passivation sub-layer 53 needs to be separately deposited at the side of the doped conductive layer 3 away from the tunnel dielectric layer 2 in a single-insertion manner. In this case, the productivity is low, and the manufacturing cost is easily increased. Moreover, if a second passivation layer 7 at the second surface 1b side of the solar cell 100 also includes the same film as the first passivation sub-layer 53, separate deposition is required due to different thickness requirements for the passivation layer at the first surface 1*a* side and the second surface 1*b* side, as a result, a forming process thereof is complicated, leading to low productivity and increased manufacturing costs.

In the present disclosure, for the first passivation layer 5, the first passivation sub-layer 53 is provided at the third region 51, so that the passivation effect of the first passivation layer 5 can be further improved, and the first passivation layer 5 and the second passivation layer 7 at the second surface 1*b* side can be simultaneously formed, thereby reducing the forming process of the solar cell 100, improving the forming efficiency of the solar cell 100, and saving the manufacturing costs.

It should be noted that, as shown in FIG. 1, the metal region 11 and the non-metal region 12 are termed with respect to a position of a metal electrode. That is, the metal region 11 is a region of the substrate 1 corresponding to the growth position of the metal electrode, but a size thereof does not completely correspond to each other, and a projection area of the metal region 11 along the thickness direction Z may be greater than or equal to a projection area of the metal electrode in the corresponding region along the thickness direction Z, so as to ensure that the metal region 11 is large enough, so that the metal electrode can be formed in this region in a metallization process, thereby reducing the forming difficulty.

Figure 8:
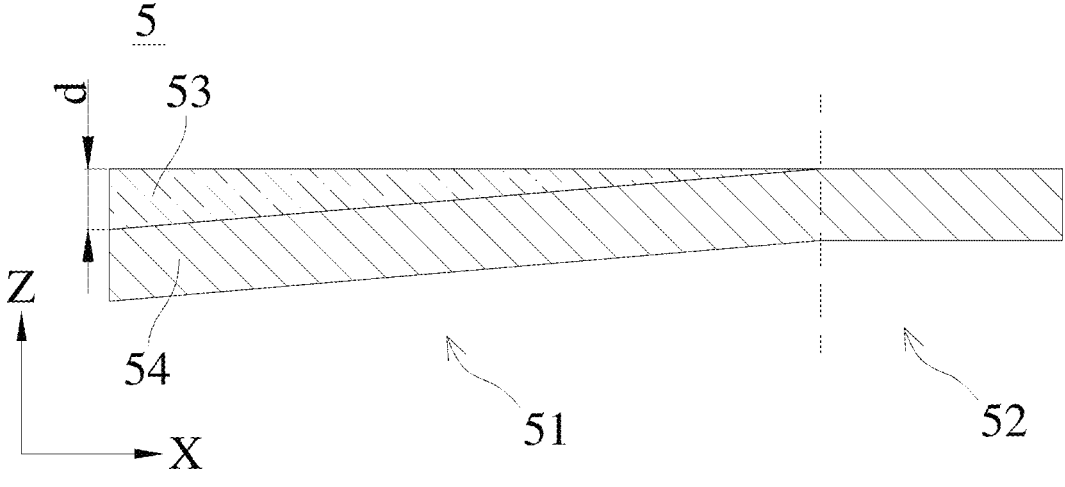
FIG. 8 is a sectional view of a first passivation layer of a solar cell according to one or more embodiments of the present disclosure.
Figure 9:
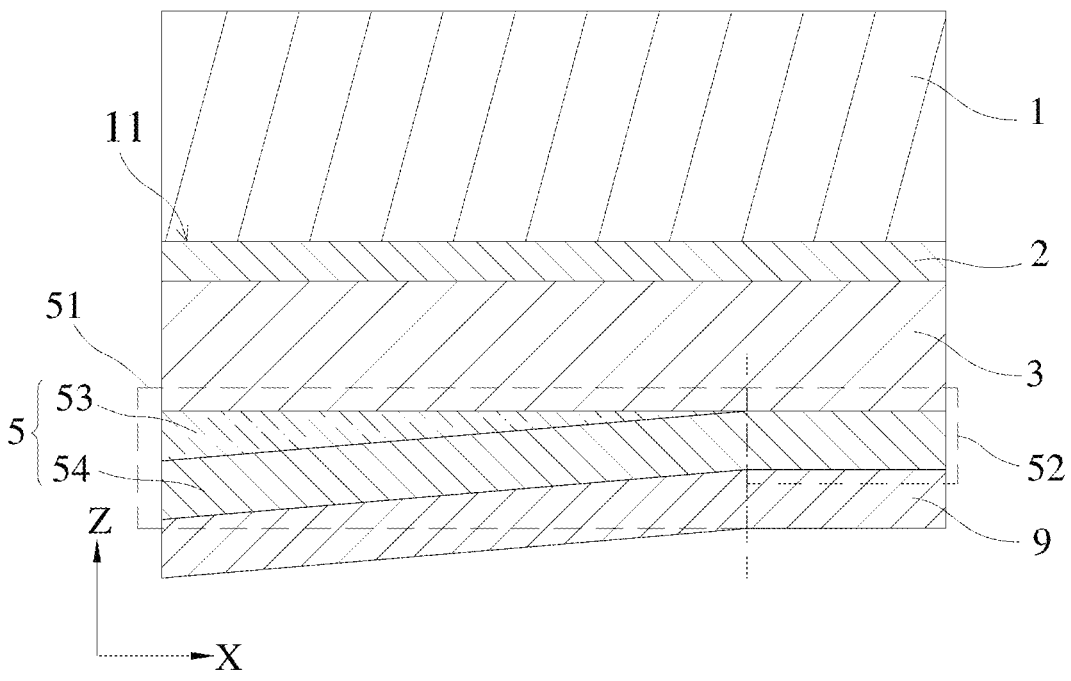
FIG. 9 is a sectional view of a solar cell at a metal region according to one or more embodiments of the present disclosure.
Figure 10:
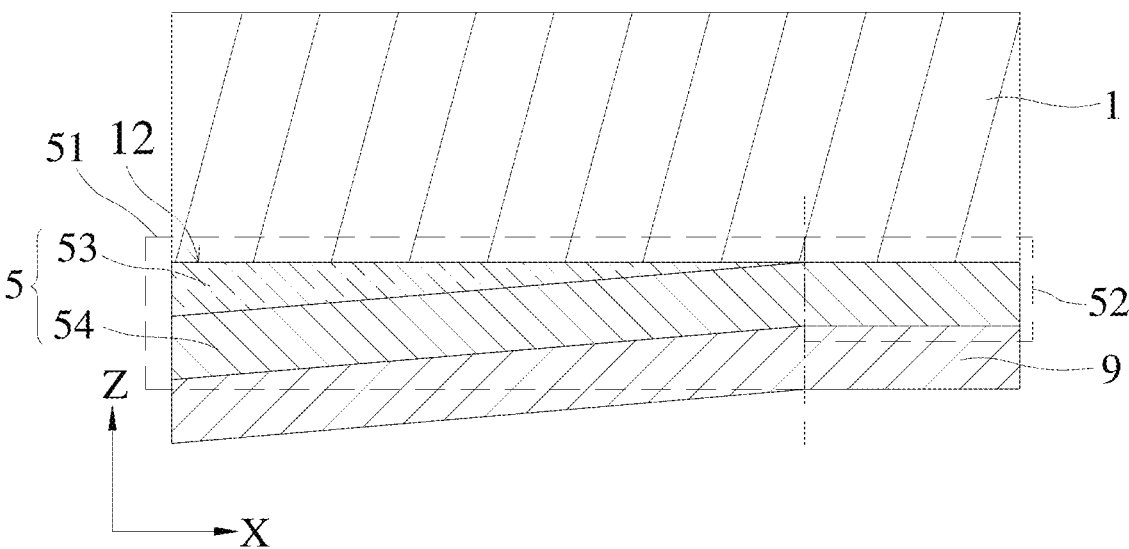
FIG. 10 is a sectional view of a solar cell at a non-metal region according to one or more embodiments of the present disclosure.

In some embodiments, as shown in FIG. 8 to FIG. 10, a thickness of the first passivation sub-layer 53 gradually decreases along a direction from the third region 51 to the fourth region 52.

In some embodiments, as shown in FIG. 8 to FIG. 10, the first passivation layer 5 of the solar cell 100 is entirely thicker at the third region 51, and is thinner at the fourth region 52, so that the passivation effect of the first passivation layer 5 at the third region 51 can be further improved, and recombination at a position of the solar cell 100 corresponding to the third region 51 is reduced, thereby further improving the photoelectric conversion efficiency of the solar cell 100.

Further, as shown in FIG. 8 to FIG. 10, the thickness d of the first passivation sub-layer 53 ranges from 1 nm to 5 nm. For example, the thickness d of the first passivation sub-layer 53 is 1 nm, 2 nm, 3 nm, 4 nm, 5 nm, or the like, and certainly, the thickness of the first passivation sub-layer 53 may also be other value within the above-mentioned range, and may be specifically set according to actual requirements, no limitation is made herein.

If the thickness d of the first passivation sub-layer 53 is excessively large, for example, d>5 nm, the time and material for forming the first passivation sub-layer 53 may be increased, thereby reducing the forming efficiency and increasing the manufacturing costs. If the thickness d of the first passivation sub-layer 53 is excessively small, for example, d<1 nm, the passivation effect of the first passivation sub-layer 53 is poor, and a good passivation effect cannot be brought.

In some embodiments, as shown in FIG. 8 to FIG. 10, when the thickness d of the first passivation sub-layer 53 satisfies the above-mentioned range, the first passivation sub-layer 53 can be conveniently formed, the forming efficiency can be improved, the manufacturing costs can be saved, the first passivation sub-layer 53 brings a good passivation effect, and the passivation effect of the first passivation layer 5 at the third region 51 can be improved, thereby improving the performance of the solar cell 100.

In some embodiments, as shown in FIG. 5, FIG. 8, FIG. 9 and FIG. 10, the first passivation sub-layer 53 may be an aluminum oxide layer.

In some embodiments, as shown in FIG. 5, FIG. 8, FIG. 9 and FIG. 10, aluminum oxide can improve the surface passivation effect of the solar cell 100, improve the photoelectric conversion efficiency of the solar cell 100, and facilitate simultaneous formation of the second passivation layer 7. In addition, the aluminum oxide has high stability and wear resistance, so that the surface of the solar cell 100 can be protected, and the solar cell 100 can be protected from corrosion, thus prolonging the service life of the solar cell 100. Therefore, when the first passivation sub-layer 53 is an aluminum oxide layer, better passivation and protection effects on the solar cell 100 can be brought, the efficiency of the solar cell 100 can be improved, and the service life of the solar cell 100 can be prolonged.

When the first passivation sub-layer 53 is an aluminum oxide layer, the first passivation sub-layer may be formed by an atomic layer deposition (ALD) technology, or other manners, no limitation is made herein.

In some embodiments, as shown in FIG. 5, FIG. 8, FIG. 9 and FIG. 10, the first passivation layer 5 further includes a second passivation sub-layer 54, the second passivation sub-layer 54 is arranged at the third region 51 and the fourth region 52, and the first passivation sub-layer 53 and at least part of the second passivation sub-layer 54 are stacked.

In some embodiments, as shown in FIG. 5, FIG. 8, FIG. 9 and FIG. 10, the arrangement of the second passivation sub-layer 54 can further improve the passivation effect of the first passivation layer 5 at the third region 51, and meanwhile can guarantee the passivation effect of the first passivation layer 5 at the fourth region 52, thereby guaranteeing the overall passivation effect of the first passivation layer 5, reducing the interface state density of the surface of the solar cell 100, reducing the recombination of the minority carriers, and improving the efficiency of the solar cell 100.

As shown in FIG. 5, FIG. 8, FIG. 9 and FIG. 10, the second passivation sub-layer 54 may be a silicon oxide layer, so as to reduce the forming difficulty of the second passivation sub-layer 54 and improve the forming efficiency. Certainly, the second passivation sub-layer 54 may be of other passivation film structures, no limitation is made herein.

In some embodiments, a thickness of the second passivation sub-layer 54 may range from 1 nm to 10 nm, so as to avoid that the second passivation sub-layer 54 is excessively thin and thus cannot achieve passivation and protection functions, as well as avoid that the second passivation sub-layer 54 is excessively thick to affect the transmission efficiency of the carriers.

In some embodiments, as shown in FIG. 5, FIG. 8, FIG. 9 and FIG. 10, the solar cell 100 further includes an antireflection layer 9 arranged at a side of the first passivation layer 5 away from the substrate 1.

In some embodiments, as shown in FIG. 5, FIG. 8, FIG. 9 and FIG. 10, the antireflection layer 9 reduces or eliminates light reflected by the surface of the solar cell 100 and increases the amount of transmitted light, thereby further improving the photoelectric conversion efficiency of the solar cell.

The antireflection layer 9 may be a silicon nitride layer, thereby further lowering the forming difficulty of the solar cell 100, and improving the forming efficiency. Certainly, the antireflection layer 9 may be a silicon oxynitride layer, or have a single-layer or tandem structure formed by silicon nitride and silicon oxynitride, or have other antireflection film structure, no limitation is made herein.

In some embodiments, a thickness of the antireflection layer 9 can range from 30 nm to 150 nm, thereby avoiding that the antireflection layer 9 is excessively thin and thus cannot achieve the function of reducing or eliminating the light reflected by the surface of the solar cell 100, as well as avoid that the antireflection layer 9 is excessively thick to reduce the amount of the transmitted light to affect the photoelectric conversion efficiency of the solar cell.

It should be noted that the solar cell 100 may be an uncut monolithic solar cell, or a half-cut solar cell or a segmented solar cell formed by equally cutting a formed monolithic solar cell into two, three, four or more cut solar cells along the thickness direction Z, no limitation is made herein.

Figure 6:
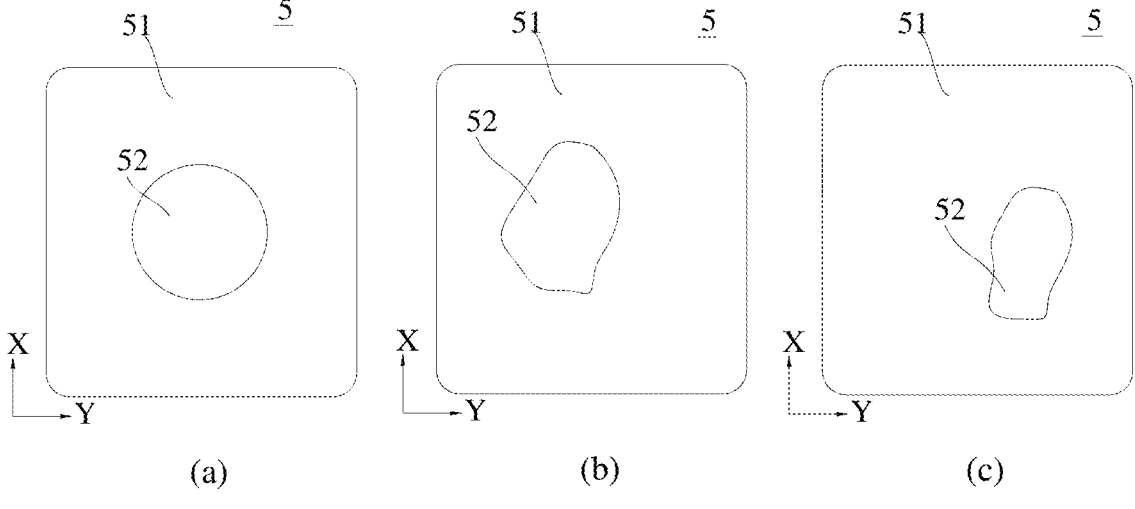
FIG. 6 is a top view of a first passivation layer of a solar cell according to one or more embodiments of the present disclosure.

For example, as shown in FIG. 6, in some embodiments, the solar cell 100 may be an uncut monolithic solar cell, and the first passivation layer 5 may have a structure in which the third region 51 surrounds and is connected to a periphery of the fourth region 52, as shown in FIG. 6(a) to FIG. 6(c). For example, as shown in FIG. 7, in some embodiments, the solar cell 100 may be a half-cut solar cell or a segmented solar cell formed by equally cutting a formed monolithic solar cell into two, three, four or more cut solar cells along the thickness direction Z, and the first passivation layer 5 may have a structure in which the third region 51 and the fourth region 52 are arranged sequentially along a first direction X of the solar cell 100, as shown in FIG. 7(a) to FIG. 7(f).

Figure 7:
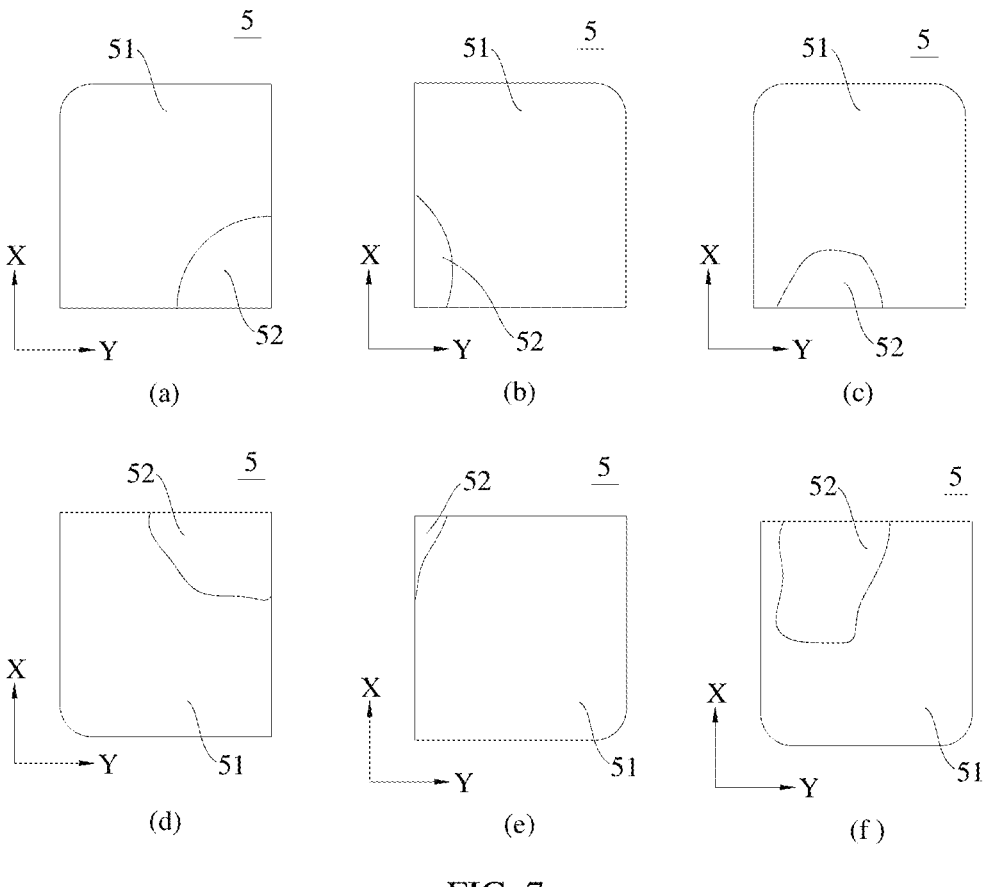
FIG. 7 is a top view of a first passivation layer of a solar cell according to one or more embodiments of the present disclosure.

The half-cut solar cell or the segmented solar cell shown in FIG. 7 can be formed by cutting the monolithic solar cell shown in FIG. 6. For example, the segmented solar cell shown in FIG. 7(a) is formed by cutting the monolithic solar cell shown in FIG. 6(a).

In some embodiments, as shown in FIG. 6 to FIG. 8, along the thickness direction Z of the solar cell 100, a ratio of the surface area of the fourth region 52 to that of the first passivation layer 5 is greater than 0 and smaller than or equal to 40%. For example, the ratio of the surface area of the fourth region 52 to that of the first passivation layer 5 is 10%, 20%, 30%, or 40%, and certainly, the ratio of the surface area of the fourth region 52 to that of the first passivation layer 5 may be other value within the above-mentioned range, and may be specifically set according to actual requirements, no limitation is made herein.

If the ratio of the surface area of the fourth region 52 to that of the first passivation layer 5 is excessively large (for example, larger than 40%), the area of the third region 51 for arranging the first passivation sub-layer 53 is excessively small, thus easily decreasing the passivation effect of the first passivation sub-layer 53. Therefore, the ratio of the surface area of the fourth region 52 to that of the first passivation layer 5 is within the above-mentioned range, so that the first passivation sub-layers 53 can be reduced while the good passivation effect of the first passivation layer 5 is guaranteed, thereby improving the forming efficiency and saving the manufacturing costs.

In addition, a shape of the fourth region 52 may be a circle, an ellipse, or other irregular shape, so as to further improve the freedom of the structural design of the solar cell 100, no limitation is made herein.

Figure 3:
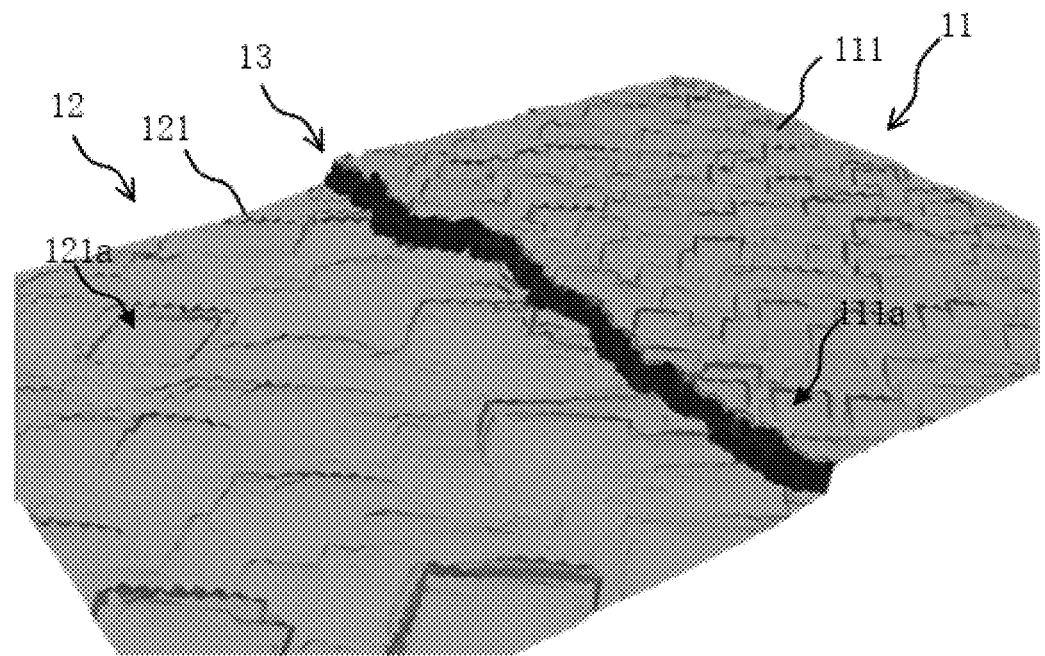
FIG. 3 is a scanning electron microscope image of a first surface of a substrate of a solar cell according to one or more embodiments of the present disclosure.
Figure 11:
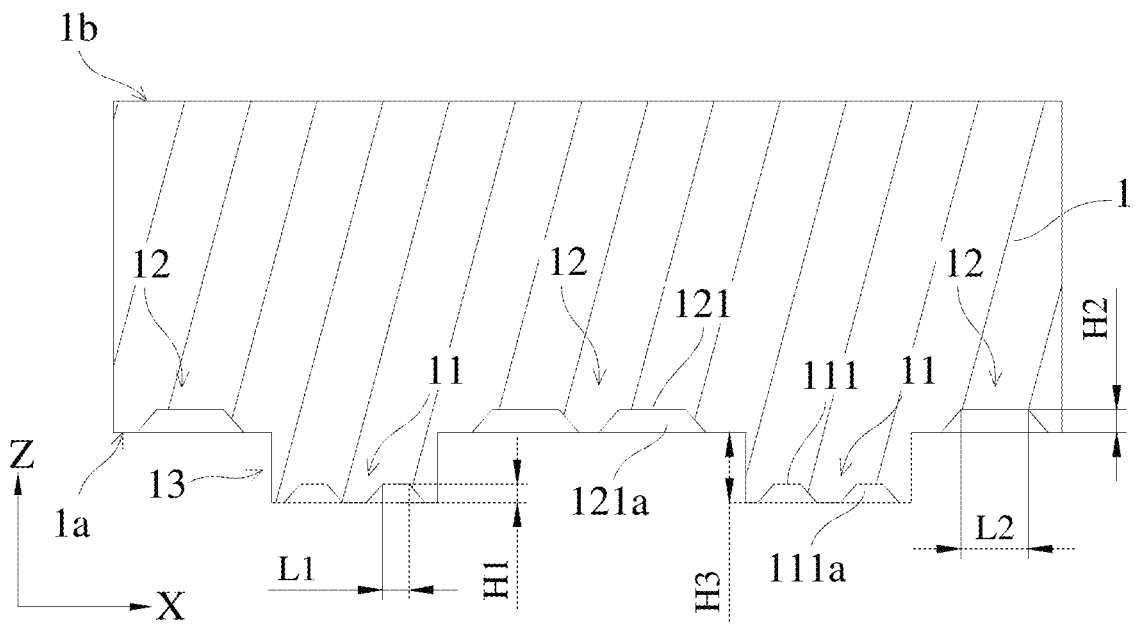
FIG. 11 is a sectional view of a substrate of a solar cell according to one or more embodiments of the present disclosure.

In some embodiments, as shown in FIG. 3, FIG. 5 and FIG. 11, the one-dimensional size L1 of the bottom surface of the first recess 111a ranges from 5 μm to 10 μm. For example, the one-dimensional size L1 of the bottom surface of the first recess 111a may be 5 μm, 6 μm, 7 μm, 8 μm, 9 μm, 10 μm, or the like, and certainly, the one-dimensional size L1 of the bottom surface of the first recess 111a may also be other value within the above-mentioned range, and may be specifically set according to actual requirements, no limitation is made herein.

As shown in FIG. 3, FIG. 5 and FIG. 11, if the one-dimensional size L1 of the bottom surface of the first recess 111a is excessively small (for example, L1<5 μm), recombination at a part of the metal region 11 not covered by a finger electrode 42 is increased, which is not favorable for passivation at the metal region 11. If the one-dimensional size L1 of the bottom surface of the first recess 111a is excessively large (for example, L1>10 μm), the ratio of the surface area to the plane area at the metal region 11 is small, which is not favorable for improving the performance of metal contact between the doped conductive layer 3 and the finger electrode 42.

In some embodiments, as shown in FIG. 3, FIG. 5 and FIG. 11, when the one-dimensional size L1 of the bottom surface of the first recess 111a ranges from 5 μm to 10 μm, the metal region 11 can obtain higher passivation quality and a better performance of metal contact between the doped conductive layer 3 and the finger electrode 42 can be achieved, and thus obtaining a higher open-circuit voltage and fill factor, thereby improving the conversion efficiency of the solar cell 100.

The bottom surface of the first recess 111a is a polygonal plane, and in some embodiments, the bottom surface of the first recess 111a may be formed as at least one shape of a diamond shape, a square shape, a trapezoid shape, an approximate diamond shape, an approximate square shape, and an approximate trapezoid shape, and certainly, the bottom surface of the first recess 111a may be in other polygonal shape, no limitation is made herein.

Figure 12:
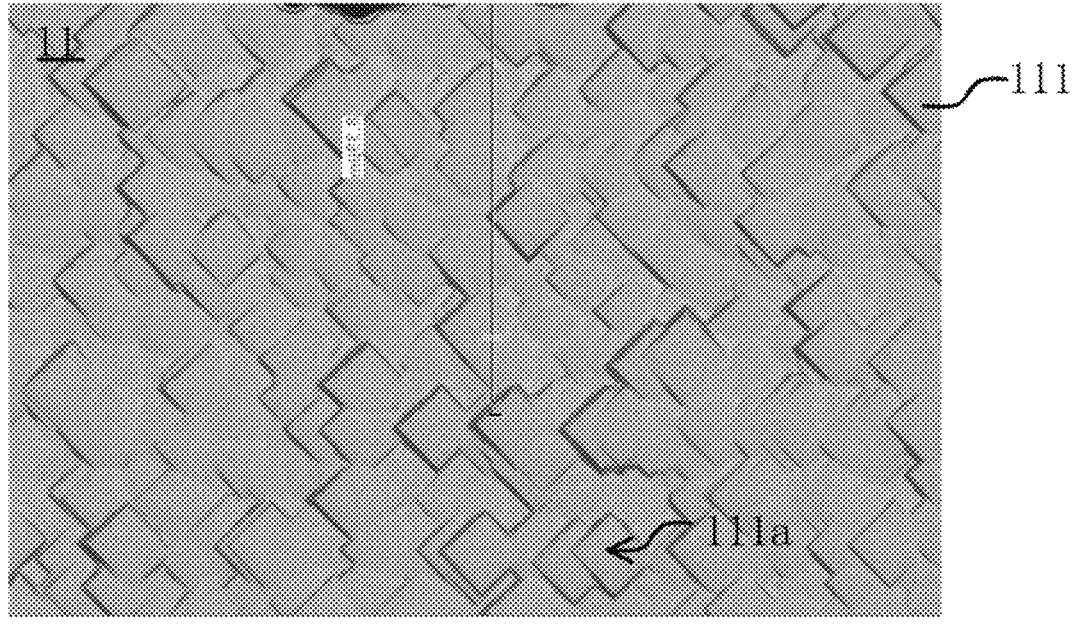
FIG. 12 is a scanning electron microscope image of a first texture structure at a substrate of a solar cell according to one or more embodiments of the present disclosure.

In some embodiments, as shown in FIG. 12, in the first texture structure 111, at least parts of projections of bottoms of at least two first recesses 111a along the thickness direction Z of the substrate 1 overlap with each other or are adjacent to each other, so that the roughness of the surface of the metal region 11 can be further increased, and the metal paste can be better filled therein, thereby further improving the performance of metal contact between the doped conductive layer 3 and the finger electrode 42 in the metal region 11, and improving the conversion efficiency of the solar cell 100.

In some embodiments, as shown in FIG. 5 and FIG. 11, a depth H1 of the first recess 111a ranges from 0.05 μm to 2 μm. For example, the depth H1 of the first recess 111a may be 0.05 μm, 0.1 μm, 0.15 μm, 0.2 μm, or the like, and certainly, the depth H1 of the first recess 111a may be other value within the above-mentioned range, and may be specifically set according to actual requirements, no limitation is made herein.

In some embodiments, as shown in FIG. 5 and FIG. 11, when the depth H1 of the first recess 111a ranges from 0.05 μm to 2 μm, the metal region 11 can be guaranteed to have a large ratio of the surface area to the plane area, so that the performance of metal contact between the finger electrode 42 and the doped conductive layer 3 in the metal region 11 can be improved, and in addition, the recombination at the surface of the metal region 11 is prevented from being increased, which is beneficial to improving the passivation effect of the metal region 11.

In some embodiments, as shown in FIG. 3, FIG. 5 and FIG. 11, the one-dimensional size L2 of the bottom surface of the second recess 121a ranges from 10 μm to 25 μm. Further, the one-dimensional size L2 of the bottom surface of the second recess 121a ranges from 15 μm to 25 μm. For example, the one-dimensional size L2 of the bottom surface of the second recess 121a may be 10 μm, 12 μm, 15 μm, 20 μm, 22 μm, 24 μm, 25 μm, or the like, and certainly, the one-dimensional size L2 of the bottom surface of the second recess 121a may also be other value within the above-mentioned range, and may be specifically set according to actual requirements, no limitation is made herein.

As shown in FIG. 5 and FIG. 11, if the one-dimensional size L2 of the bottom surface of the second recess 121a is excessively small, for example, L2<10 μm, the ratio of the surface area to the plane area of the non-metal region 12 is increased, and the recombination in this region is increased, which is not favorable for passivation of the non-metal region 12. If the one-dimensional size L2 of the bottom surface of the second recess 121a is excessively large, for example, L2>25 μm, the forming difficulty of the second recess 121a is increased, and during the forming process of the second recess 121a, an arc-shaped convex structure may be formed at the surface of the non-metal region 12, which is not favorable for passivation of the non-metal region 12.

In some embodiments, as shown in FIG. 3, FIG. 5 and FIG. 11, when the one-dimensional size L2 of the bottom surface of the second recess 121a ranges from 10 μm to 25 μm, the forming difficulty of the non-metal region 12 can be reduced, the forming efficiency can be improved, and the non-metal region 12 can obtain higher passivation quality, thus improving the conversion efficiency of the solar cell 100.

The bottom surface of the second recess 121a is a polygonal plane, and in some embodiments, the bottom surface of the second recess 121a may be formed as at least one shape of a diamond shape, a square shape, a trapezoid shape, an approximate diamond shape, an approximate square shape, and an approximate trapezoid shape, and certainly, the bottom surface of the second recess 121a may be formed as other polygonal shape, no limitation is made herein.

Figure 13:
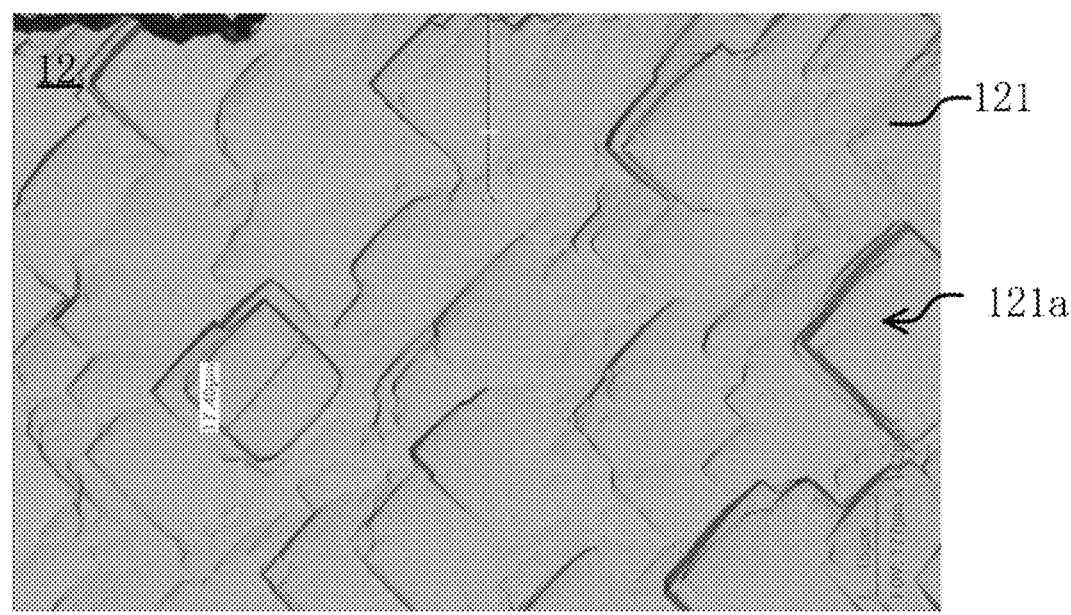
FIG. 13 is a scanning electron microscope image of a second texture structure at a substrate of a solar cell according to one or more embodiments of the present disclosure.

In some embodiments, as shown in FIG. 13, in the second texture structure 121, at least parts of projections of bottoms of at least two second recesses 121a along the thickness direction Z of the substrate 1 overlap with each other or are adjacent to each other, so that the roughness of the surface of the non-metal region 12 can be increased, and the internal reflectivity of the non-metal region 12 is improved, which is favorable for improving the conversion efficiency of the solar cell 100.

In some embodiments, as shown in FIG. 5 and FIG. 6, a depth H2 of the second recess 121a ranges from 0.05 μm to 2 μm. For example, the depth H2 of the second recess 121a may be 0.05 μm, 0.1 μm, 0.15 μm, 0.2 μm, or the like, and certainly, the depth H2 of the second recess 121a may be other value within the above-mentioned range, and may be specifically set according to actual requirements, no limitation is made herein.

In some embodiments, as shown in FIG. 5 and FIG. 6, when the depth H2 of the second recess 121a ranges from 0.05 μm to 2 μm, the roughness of the second texture structure 121 at the non-metal region 12 can be controlled within a required range, and the recombination at the surface of the non-metal region 12 can be prevented from being increased, which is beneficial to improving the passivation effect of the non-metal region 12.

Figure 14:
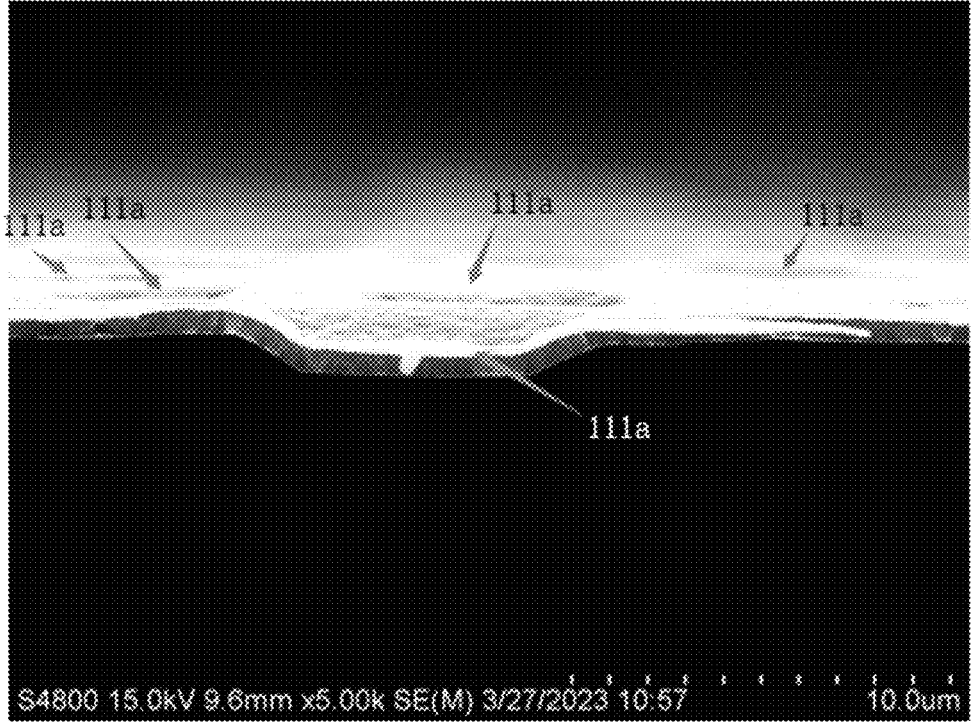
FIG. 14 is a scanning electron microscope image of a first texture structure at a substrate of a solar cell according to one or more embodiments of the present disclosure at another angle.

In some embodiments, as shown in FIG. 11 and FIG. 14, a sectional shape of the first recess 111a and/or the second recess 121a is one or more of a diamond shape, a square shape, and a trapezoid shape, so as to reduce the forming difficulty of the first recess 111a and/or the second recess 121a and improve the design freedom of the solar cell 100. Certainly, the sectional shape of the first recess 111a and/or the second recess 121a may be other shapes, and may be specifically set according to actual requirements, no limitation is made herein.

In some embodiments, as shown in FIG. 2, FIG. 3, FIG. 5 and FIG. 11, a top surface of the metal region 11 protrudes relative to a top surface of the non-metal region 12 in the thickness direction Z of the substrate 1.

In some embodiments, as shown in FIG. 2, FIG. 3, FIG. 5 and FIG. 11, the top surface of the metal region 11 protrudes relative to the top surface of the non-metal region 12, so that the metal region 11 can be used as an alignment basis for the first electrode 4 in the process of forming the first electrode 4, thereby facilitating the formation of the first electrode 4 and improving the forming efficiency of the solar cell 100.

In some embodiments, as shown in FIG. 2, FIG. 3, FIG. 5 and FIG. 11, in the thickness direction Z of the substrate 1, a height difference H3 between the top surface of the metal region 11 and the top surface of the non-metal region 12 ranges from 1 μm to 10 μm. For example, the height difference H3 between the top surface of the metal region 11 and the top surface of the non-metal region 12 is 1 μm, 2 μm, 4 μm, 6 μm, 8 μm, 10 μm, or the like, and certainly, the height difference H3 between the top surface of the metal region 11 and the top surface of the non-metal region 12 may be other value within the above-mentioned range, and may be specifically set according to actual requirements, no limitation is made herein.

As shown in FIG. 2, FIG. 3, FIG. 5 and FIG. 11, if the height difference H3 between the top surface of the metal region 11 and the top surface of the non-metal region 12 is excessively large, for example, H3>10 μm, an overall thickness of the substrate 1 is increased, and when passivating the first surface 1a of the substrate 1, the passivation layer at a transition region 13 between the metal region 11 and the non-metal region 12 may generate an uneven phenomenon, which would affect collection of the carriers. If the height difference H3 between the top surface of the metal region 11 and the top surface of the non-metal region 12 is excessively small, for example, H3<1 μm, it is not favorable for identifying alignment of the metal region 11 and the first electrode 4, as a result, the formation of the first electrode 4 is not facilitated.

In some embodiments, as shown in FIG. 2, FIG. 3, FIG. 5 and FIG. 11, when the height difference H3 between the top surface of the metal region 11 and the top surface of the non-metal region 12 ranges from 1 μm to 10 μm, the first surface 1a can obtain a higher passivation quality, collection of the carriers can be facilitated, and the metal region 11 can be used as the alignment basis for the first electrode 4 in the process of forming the first electrode 4, thereby facilitating the formation of the first electrode 4, and a reflective surface of the first surface 1a can be increased, thereby improving the optical internal reflection effect at the first surface 1a of the solar cell 100, and improving the conversion efficiency of the solar cell 100.

Figure 15:
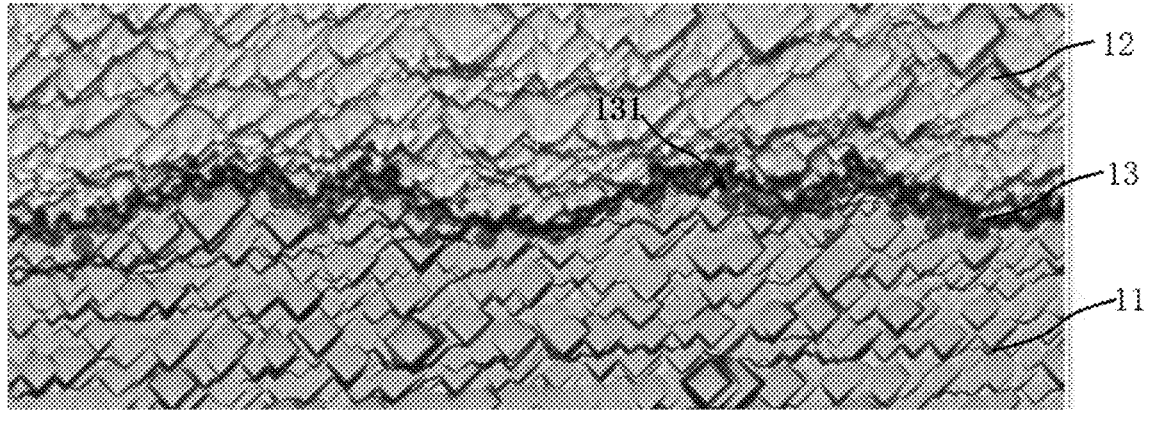
FIG. 15 is a scanning electron microscope image of a first surface of a substrate of a solar cell according to one or more embodiments of the present disclosure at another angle.

In some embodiments, as shown in FIG. 2, FIG. 3 and FIG. 15, the first surface 1a further includes the transition region 13, the transition region 13 is connected between the metal region 11 and the non-metal region 12, and the transition region 13 is provided with one or more holes 131.

In some embodiments, as shown in FIG. 2, FIG. 3 and FIG. 15, the arrangement of the hole 131 in the transition region 13 facilitates transmission of the carriers, and can improve the utilization rate of the incident light at the first surface 1a, which is favorable for improving the performance of the solar cell 100.

In some embodiments, as shown in FIG. 15, a diameter of the hole 131 ranges from 0.5 μm to 5 μm. For example, the diameter of the hole 131 may be 0.5 μm, 1 μm, 2 μm, 3 μm, 4 μm, 5 μm, or the like, and certainly, the diameter of the hole 131 may be other value within the above-mentioned range, and may be specifically set according to actual requirements, no limitation is made herein.

In some embodiments, as shown in FIG. 15, when the diameter of the hole 131 ranges from 0.5 μm to 5 μm, the arrangement of the transition region 13 facilitates the transmission of the carriers, improves the utilization rate of the incident light at the first surface 1a, facilitates the improvement of the performance of the solar cell 100, and can ensure that the first surface 1a can obtain a higher passivation quality. If the diameter of the hole 131 is excessively large, for example, larger than 5 μm, passivation at the transition region 13 may be affected, and if the diameter of the hole 131 is excessively small, for example, smaller than 0.5 μm, the above-mentioned effect cannot be brought.

In some embodiments, when forming the first texture structure 111 and the second texture structure 121 by laser etching, the first texture structure 111 is usually formed at the first surface 1a by laser etching, and then, the second texture structure 121 is formed by performing laser etching at the non-metal region 12 to remove an excess film. During the formation of the solar cell 100, the hole 131 is formed at an edge near the metal region 11 when applying laser to the non-metal region 12.

In some other embodiments, when forming the first texture structure 111 and the second texture structure 121 by chemical etching, the first texture structure 111 is usually formed at the first surface 1a by laser etching, the metal region 11 is then masked (for example, the metal region 11 is masked by using a chemical reagent), and then, the non-metal region 12 not covered by a mask is etched by using a chemical reagent to form the second texture structure 121. During the formation of the solar cell 100, the hole 131 is formed by etching at the edge near the metal region 11 when etching the non-metal region 12 by the chemical reagent.

In some embodiments, as shown in FIG. 15, a depth of the hole 131 ranges from 0.5 μm to 2 μm. For example, the depth of the hole 131 may be 0.5 μm, 1 μm, 1.5 μm, 2 μm, or the like, and certainly, the depth of the hole 131 may be other value within the above-mentioned range, and may be specifically set according to actual requirements, no limitation is made herein.

In some embodiments, as shown in FIG. 15, when the depth of the hole 131 ranges from 0.5 μm to 2 μm, the arrangement of the transition region 13 facilitates the transmission of the carriers, improves the utilization rate of the incident light at the first surface 1a, facilitates the improvement of the performance of the solar cell 100, and can ensure that the first surface 1a can obtain a higher passivation quality. If the depth of the hole 131 is excessively large, for example, larger than 2 μm, the passivation at the transition region 13 may be affected; and if the depth of the hole 131 is excessively small, for example, smaller than 0.5 μm, the above-mentioned effect cannot be brought.

Figure 16:
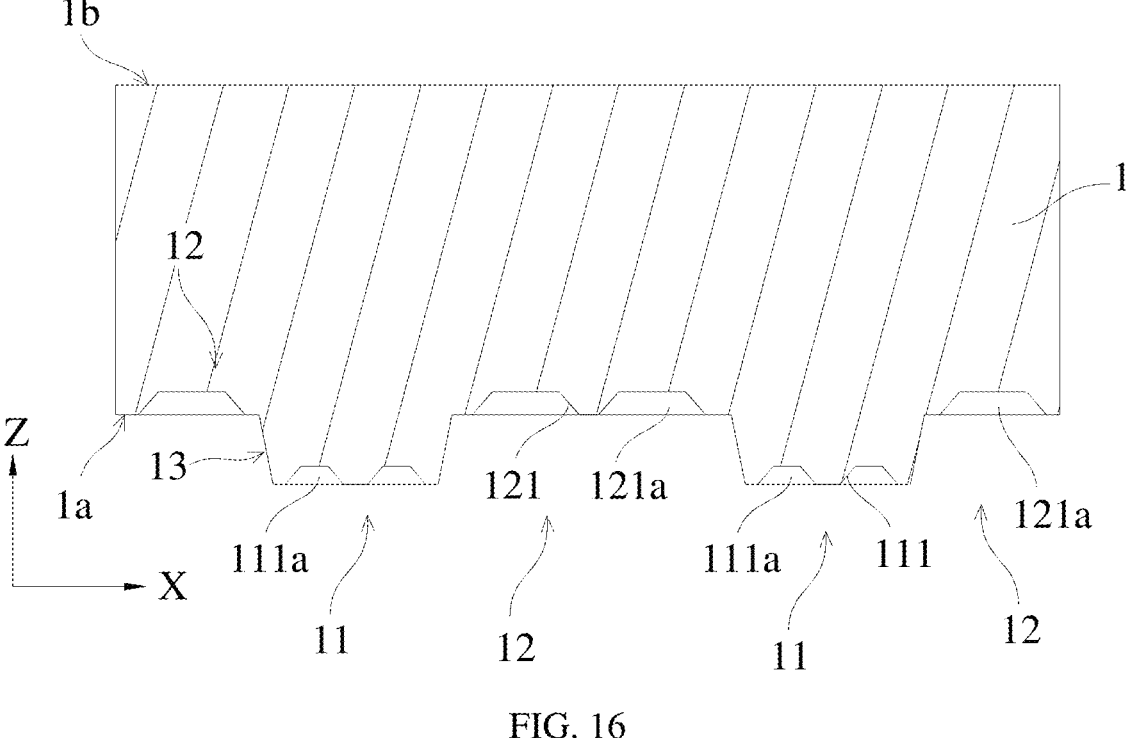
FIG. 16 is a sectional view of a substrate of a solar cell according to one or more embodiments of the present disclosure.

For example, as shown in FIG. 16, the transition region 13 is arranged obliquely relative to the metal region 11 and the non-metal region 12. For example, as shown in FIG. 11, the transition region 13 may be substantially perpendicular to the metal region 11 and the non-metal region 12. This structure arrangement can improve the design freedom of the solar cell 100 and reduce the forming difficulty of the solar cell 100, which is favorable for improving the passivation quality of the first surface 1a.

In some embodiments, as shown in FIG. 1 to FIG. 5, the metal region 11 may include first regions 112 and second regions 113, the first regions 112 are arranged at intervals in the first direction X, the second regions 113 are connected between adjacent first regions 112, the second regions 113 are arranged at intervals in a second direction Y, and an included angle is formed between the first direction X and the second direction Y. The first electrode 4 includes a plurality of finger electrodes 42, which are arranged at a side of the doped conductive layer 3 away from the tunnel dielectric layer 2 and electrically connected to the doped conductive layer 3. The finger electrodes 42 are arranged at intervals in the first direction X and correspond to the first regions 112.

The first direction X and the second direction Y may be perpendicular to each other, or have an included angle smaller than 90 degrees, which may be for example 60 degrees, 45 degrees, 30 degrees, or the like, as long as the first direction X and the second direction Y are not a same direction. For convenience of description and understanding, in some embodiments, the first direction X and the second direction Y being perpendicular to each other is taken as an example for description, in specific applications, the included angle between the first direction X and the second direction Y may be adjusted according to actual needs and application scenarios, no limitation is made herein.

In some embodiments, the finger electrodes 42 are arranged to directly face the first regions 112 of the metal region 11, and are electrically connected to the doped conductive layers 3 arranged at the first regions 112, so as to realize the collection of the photogenerated carriers. In addition, the carriers between the doped conductive layers 3 at two adjacent first regions 112 can be transversely transmitted in the first direction X through the doped conductive layers 3 arranged at the second regions 113, thereby improving the transverse transmission capability of the solar cell 100.

As shown in FIG. 1, in the first direction X, a width W1 of the doped conductive layer 3 located above the first region 112 may range from 100 μm to 600 μm to ensure that the width W1 of the doped conductive layer 3 is greater than or equal to a width W2 of the finger electrode 42, thereby improving the effect of metal contact between the doped conductive layer 3 and the finger electrode 42. The width W1 of the doped conductive layer 3 located above the first region 112 may be 100 μm, 200 μm, 300 μm, 400 μm, 500 μm, 600 μm, or the like, and the width W1 thereof may be other value within the above-mentioned range, and can be specifically set according to actual requirements, no limitation is made herein.

As shown in FIG. 1, in the second direction Y, a width of the doped conductive layer 3 located above the second region 113 may range from 150 μm to 600 μm, so as to improve the effect of carrier transmission by the doped conductive layer 3 above the second region 113 in the second direction Y. The width of the doped conductive layer 3 located above the second region 113 may be 150 μm, 200 μm, 300 μm, 400 μm, 500 μm, 600 μm, or the like, or may be other value within the above-mentioned range, and can be specifically set according to actual requirements, no limitation is made herein.

In some embodiments, as shown in FIG. 1 and FIG. 2, in the first direction X, a width W3 of the first region 112 may be 2 to 25 times the width W2 of the finger electrode 42 correspondingly arranged in this region, so as to ensure that the first region 112 is large enough, so that the doped conductive layer 3 formed above the first region 112 can have a large surface area, thereby enabling the finger electrode 42 to be formed in the first region 112 during a metallization process, and ensuring that the finger electrode 42 and the doped conductive layer 3 can form a stable electrical connection to improve the forming efficiency. W3 may be 2 times, 4 times, 6 times, 8 times, 10 times, 12 times, 15 times, or the like, W2; or W3 may be other value times W2 within the above-mentioned range, and can be specifically set according to actual requirements, no limitation is made herein.

Figure 4:
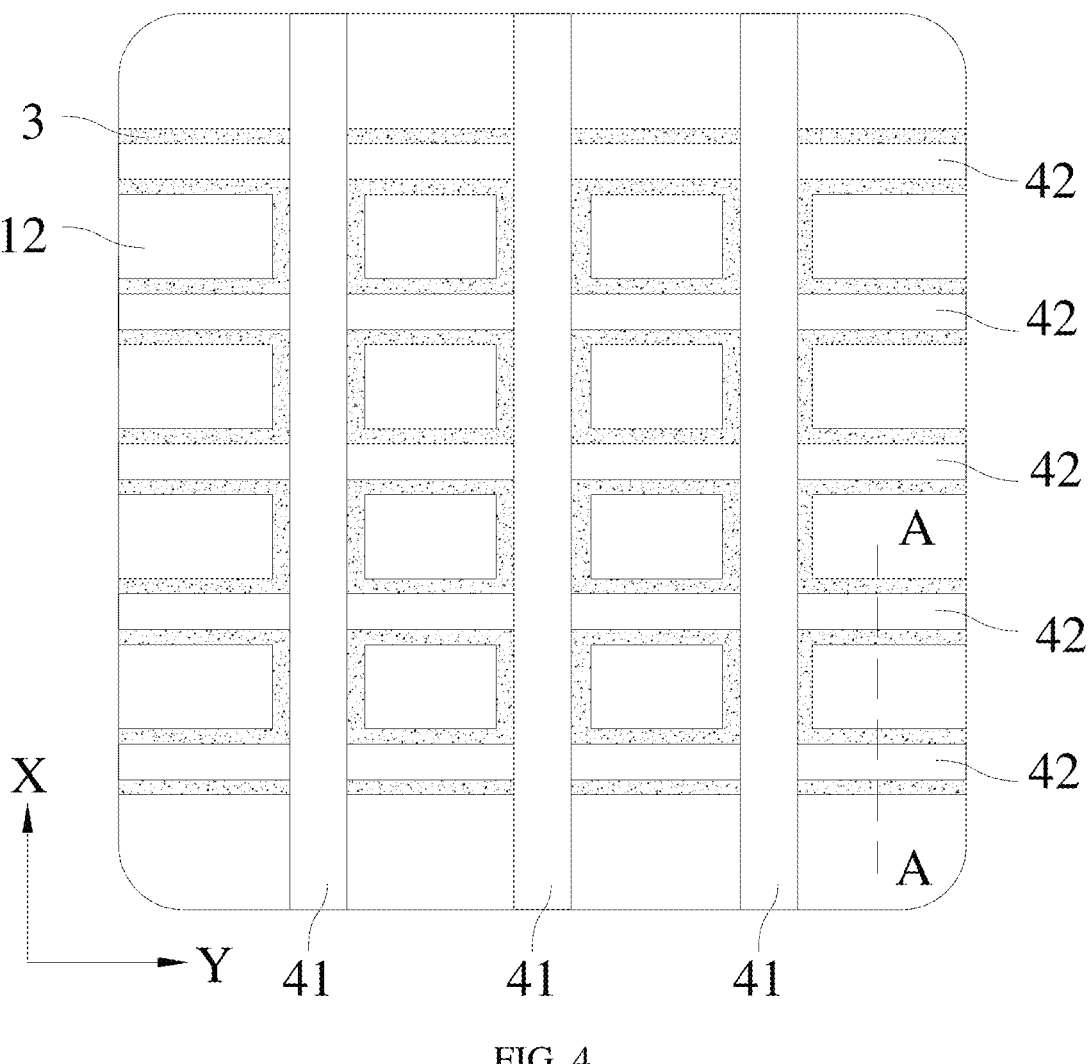
FIG. 4 is a top view of a solar cell according to one or more embodiments of the present disclosure.

In some embodiments, as shown in FIG. 1 and FIG. 4, the first electrode 4 further includes a plurality of bus electrodes 41, which are arranged at sides of the finger electrodes 42 away from the doped conductive layer 3 and electrically connected to the finger electrodes 42, and the bus electrodes 41 are arranged at intervals in the second direction Y and correspond to the second regions 113.

In some embodiments, as shown in FIG. 1 and FIG. 4, the bus electrode 41 may gather the current collected by the finger electrode 42, and may lead the current out of the solar cell, and the bus electrode 41 is arranged corresponding to the second region 113, so that the bus electrode 41 may be limited by the second region 113, thereby facilitating subsequent formation of the bus electrode 41, reducing process steps, and improving the forming efficiency.

It should be noted that the solar cell 100 may be a double-sided TOPCon cell or a single-sided TOPCon cell.

In some embodiments, as shown in FIG. 5, the solar cell 100 is a single-sided TOPCon cell. For example, a TOPCon structure is arranged at a back surface of the solar cell. The solar cell 100 further includes an emitter 6, a second passivation layer 7 and a second electrode 8.

In the thickness direction Z of the solar cell 100, the emitter 6 is formed above or in the second surface 1b of the substrate 1. A doped element in the emitter 6 and a doped element in the substrate 1 have different conductivity types, so that the two can jointly form a PN junction structure. In an example, when the substrate 1 is an N-type silicon substrate, the emitter 6 may be a P-type emitter. In another example, when the substrate 1 is a P-type silicon substrate, the emitter 6 may be an N-type emitter. In addition, for example, the emitter 6 may be formed by diffusing the doped element into the substrate 1 at the second surface 1b side of the substrate 1, and for example, when the substrate 1 is an N-type silicon substrate, the P-type emitter 6 may be formed by performing boron diffusion at the substrate 1. For example, the emitter 6 may be formed by doped polycrystalline silicon, microcrystalline silicon or amorphous silicon having a conductivity type opposite to that of the doped element of the substrate 1. For example, when the substrate 1 is an N-type silicon substrate, a tunnel layer and a polycrystalline silicon, microcrystalline silicon or amorphous silicon layer may be formed at the second surface 1b of the substrate 1 by a Low Pressure Chemical Vapor Deposition (LPCVD) method, a Plasma Enhanced Chemical Vapor Deposition (PECVD) method, or the like, and the emitter 6 may be formed by doping a P-type doped element into the polycrystalline silicon, microcrystalline silicon or amorphous silicon layer.

The second passivation layer 7 is arranged at a surface of a side of the emitter 6 away from the substrate 1. The second passivation layer 7 can well passivate a surface of a side of the emitter 6 away from the substrate 1, so as to reduce the interface state density, thereby reducing the recombination of the minority carriers, improving the transmission efficiency of the carriers at the interface, and improving the efficiency of the solar cell 100. The second passivation layer 7 can further reduce or eliminate the light reflected at the surface of the solar cell and increase the function of the transmitted light amount, thereby further improving the photoelectric conversion efficiency of the solar cell. For example, the second passivation layer 7 may be deposited by a PECVD method, and certainly, the second passivation layer 7 may also be formed by other methods, such as an organic chemical vapor deposition method. The second passivation layer 7 may have a single-layer structure or a tandem structure, and the refractive index and the thickness of each layer may be designed correspondingly. In some embodiments, the second passivation layer 7 may be any one or a combination of a silicon nitride layer, a silicon oxynitride layer and a silicon oxide layer. Certainly, the second passivation layer 7 may also be a passivation layer of another type, no limitation is made herein.

The second electrode 8 is arranged at a side of the emitter 6 away from the substrate 1, and the second electrode 8 is electrically connected to the emitter 6. In some embodiments, the second electrode 8 may be in direct or indirect contact with the emitter 6 to form an electrical connection structure. The second electrode 8 is configured to collect and gather the current of the solar cell 100. For example, the second electrode 8 may be formed by screen printing and sintering. In some embodiments, metal paste for forming the second electrode 8 may be one or more of aluminum, silver, gold, nickel, molybdenum, or copper, no limitation is made herein.

In some embodiments, the solar cell is a double-sided TOPCon cell, and for example, a front surface (light receiving surface) and a back surface (backlight surface) of the solar cell are each provided with a TOPCon structure. When the solar cell is a double-sided TOPCon cell, the front surface and the back surface thereof may have a same film structure. That is, the film structure at the second surface 1b side of the substrate 1 may be the same as that at the first surface 1a side.

Figure 17:
FIG. 17 is a schematic structural diagram of a tandem solar cell according to one or more embodiments of the present disclosure.

An embodiment of the present disclosure provides a tandem solar cell, as shown in FIG. 17, including a bottom cell, a top cell 140 and an intermediate connection layer 150. The bottom cell is the solar cell 100 as described in any one of the above-mentioned embodiments, the top cell 140 is one of a perovskite solar cell, a donor-acceptor cell, a cadmium telluride (CdTe) solar cell, a copper indium gallium selenide (CIGS) solar cell or a gallium arsenide (GaAs) solar cell, and the intermediate connection layer 150 is connected between the bottom cell and the top cell 140. Since the solar cell 100 has the above-described technical effects, the photovoltaic module including the solar cell 100 shall also have the above-described technical effects, which are not repeated herein.

As shown in FIG. 17, a band gap width of the top cell 140 is larger than that of the bottom cell, so that the tandem solar cell can have a wider spectral response range by stacking the top cell 140 above the bottom cell, thereby utilizing solar energy to the maximum extent and improving the efficiency of the solar cell.

The intermediate connection layer 150 is typically a tunnel junction or a quite thin metal or transparent electrode composite layer. For example, the intermediate connection layer 150 may be formed by a transparent conductive oxide (TCO) having good optoelectronic characteristics, high photon permeability, and high electrical conductivity, thereby enabling the top cell 140 and the bottom cell to maintain good ohmic contact.

When the solar cell 100 is the bottom cell, the first electrode 4 or the second electrode 8 of the solar cell 100 may also be used as the intermediate connection layer 150 configured to be electrically connected to the top cell 140. Furthermore, when the solar cell 100 is the bottom cell, the passivation layer and the electrode at a side of the solar cell 100 connected to the top cell 140 may be removed or be not formed, so that the solar cell 100 is connected to the top cell 140 through the intermediate connection layer 150.

Figure 18:
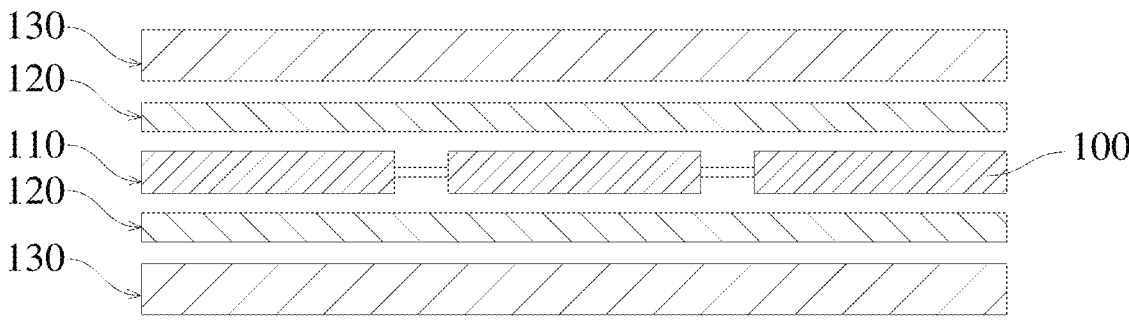
FIG. 18 is a schematic structural diagram of a photovoltaic module according to one or more embodiments of the present disclosure.

An embodiment of the present disclosure provides a photovoltaic module, as shown in FIG. 18, including a solar cell string 110, an encapsulation layer 120 and a cover plate 130. The solar cell string 110 is formed by connecting a plurality of solar cells 100 as described in any one of the above-mentioned embodiments, the encapsulation layer 120 is configured to cover a surface of the solar cell string 110, and the cover plate 130 is configured to cover a surface of the encapsulation layer 120 away from the solar cell string 110. Since the solar cell 100 has the above-described technical effects, the photovoltaic module including the solar cell 100 shall also have the above-described technical effects, which are not repeated herein.

As shown in FIG. 18, the solar cells 100 are electrically connected in a monolithic or plural-segment form to form a plurality of solar cell strings 110, and the plurality of solar cell strings 110 are electrically connected in series and/or in parallel. In some embodiments, the plural solar cell strings 110 may be electrically connected by conductive strips. The encapsulation layer 120 covers the front surface and the back surface of the solar cell. In some embodiments, the encapsulation layer 120 may be an organic encapsulation adhesive film, such as an ethylene vinyl acetate (EVA) adhesive film, a polyethylene octane elastomer (POE) adhesive film, a polyethylene terephthalate (PET) adhesive film, a polyvinyl butyral (PVB) adhesive film, or the like. The cover plate 130 may be a glass cover plate, a plastic cover plate, or the like, having a light transmitting function. In some embodiments, a surface of the cover plate 130 facing the encapsulation layer 120 may be a concave-convex surface, so as to increase the utilization rate of incident light.

Mutual reference may be made for the same and similar parts among various embodiments in this specification. In particular, as for apparatus embodiments and terminal embodiments, since they are substantially similar to method embodiments, the description is relatively simple, and reference may be made to the description in the method embodiments for relevant points.

The above description is merely an exemplary implementation of the embodiments of the present disclosure, but a protection scope of the embodiments of the present disclosure is not limited thereto, and any changes or substitutions within the technical scope disclosed by the embodiments of the present disclosure shall fall within a scope of the embodiments of the present disclosure. Therefore, the scope of the embodiments of the present disclosure shall be subject to the scope defined by the claims.

What is claimed is:

1. A solar cell, comprising:
   a substrate, wherein a first surface of the substrate comprises metal regions and non-metal regions which are distributed in an alternate manner, a metal region of the metal regions is provided with a first texture structure, the first texture structure comprising a first recess, a non-metal region of the non-metal regions is provided with a second texture structure, the second texture structure comprising a second recess, and a one-dimensional size of a bottom surface of the first recess is smaller than a one-dimensional size of a bottom surface of the second recess;
   a tunnel dielectric layer provided at a surface of the first texture structure;
   a doped conductive layer provided at a side of the tunnel dielectric layer away from the substrate;
   a first passivation layer provided at a side of the doped conductive layer away from the tunnel dielectric layer and at a surface of the second texture structure, wherein the first passivation layer comprises a third region and a fourth region, and the third region is provided with a first passivation sub-layer; and
   a first electrode provided at a side of the doped conductive layer away from the tunnel dielectric layer, wherein the first electrode is electrically connected to the doped conductive layer.

2. The solar cell according to claim 1, wherein a thickness of the first passivation sub-layer gradually decreases along a direction from the third region towards the fourth region.

3. The solar cell according to claim 1, wherein a thickness of the first passivation sub-layer ranges from 1 nm to 5 nm.

4. The solar cell according to claim 1, wherein the first passivation sub-layer is an aluminum oxide layer.

5. The solar cell according to claim 1, wherein the first passivation layer further comprises a second passivation sub-layer,
   wherein the second passivation sub-layer is arranged in the third region and the fourth region, and
   wherein the first passivation sub-layer and at least part of the second passivation sub-layer are stacked.

6. The solar cell according to claim 1, wherein the third region surrounds and is connected to a periphery of the fourth region.

7. The solar cell according to claim 1, wherein the third region and the fourth region are arranged in sequence along a first direction (X) of the solar cell.

8. The solar cell according to claim 1, wherein, in a thickness direction (Z) of the solar cell, a ratio of a surface area of the fourth region to a surface area of the first passivation layer is greater than 0 and smaller than or equal to 40%.

9. The solar cell according to claim 1, wherein the one-dimensional size of the bottom surface of the first recess ranges from 5 μm to 10 μm.

10. The solar cell according to claim 1, wherein the one-dimensional size of the bottom surface of the second recess ranges from 10 μm to 25 μm.

11. The solar cell according to claim 1, wherein a depth of the first recess ranges from 0.05 μm to 2 μm, and a depth of the second recess ranges from 0.05 μm to 2 μm.

12. The solar cell according to claim 1, wherein a top surface of the metal region protrudes relative to a top surface of the non-metal region in a thickness direction (Z) of the substrate.

13. The solar cell according to claim 1, wherein, in a thickness direction (Z) of the substrate, a height difference between a top surface of the metal region and a top surface of the non-metal region ranges from 1 μm to 10 μm.

14. The solar cell according to claim 1, wherein the first surface further comprises a transition region, the transition region is connected between the metal region and the non-metal region, and the transition region is provided with one or more holes.

15. The solar cell according to claim 14, wherein a diameter of the one or more holes ranges from 0.5 μm to 5 μm.

16. The solar cell according to claim 14, wherein a depth of the one or more holes ranges from 0.5 μm to 2 μm.

17. The solar cell according to claim 14, wherein the transition region is arranged obliquely relative to the metal region and the non-metal region.

18. The solar cell according to claim 1, wherein the solar cell further comprises an antireflection layer arranged at a side of the first passivation layer away from the substrate.

19. A tandem solar cell, comprising:

a bottom cell, which comprises a solar cell comprising:

a substrate, wherein a first surface of the substrate comprises metal regions and non-metal regions which are distributed in an alternate manner, a metal region of the metal regions is provided with a first texture structure, the first texture structure comprises a first recess, a non-metal region of the non-metal regions is provided with a second texture structure, the second texture structure comprises a second recess, and a one-dimensional size of a bottom surface of the first recess is smaller than a one-dimensional size of a bottom surface of the second recess;

a tunnel dielectric layer provided at a surface of the first texture structure;

a doped conductive layer provided at a side of the tunnel dielectric layer away from the substrate;

a first passivation layer provided at a side of the doped conductive layer away from the tunnel dielectric layer and at a surface of the second texture structure, wherein the first passivation layer comprises a third region and a fourth region, and the third region is provided with a first passivation sub-layer; and a first electrode provided at a side of the doped conductive layer away from the tunnel dielectric layer, wherein the first electrode is electrically connected to the doped conductive layer;

a top cell comprising one of a perovskite solar cell, a donor-acceptor cell, a cadmium telluride solar cell, a copper indium gallium selenide solar cell, or a gallium arsenide solar cell; and an intermediate connection layer connected between the bottom cell and the top cell.

20. A photovoltaic module, comprising:

a solar cell string which is formed by connecting a plurality of solar cells, each of the plurality of solar cells comprises:

a substrate, wherein a first surface of the substrate comprises metal regions and non-metal regions which are distributed in an alternate manner, a metal region of the metal regions is provided with a first texture structure, the first texture structure comprises a first recess, a non-metal region of the non-metal regions is provided with a second texture structure, the second texture structure comprises a second recess, and a one-dimensional size of a bottom surface of the first recess is smaller than a one-dimensional size of a bottom surface of the second recess;

a tunnel dielectric layer provided at a surface of the first texture structure;

a doped conductive layer provided at a side of the tunnel dielectric layer away from the substrate;

a first passivation layer provided at a side of the doped conductive layer away from the tunnel dielectric layer and at a surface of the second texture structure, wherein the first passivation layer comprises a third region and a fourth region, and the third region is provided with a first passivation sub-layer; and a first electrode provided at a side of the doped conductive layer away from the tunnel dielectric layer, wherein the first electrode is electrically connected to the doped conductive layer;

an encapsulation layer configured to cover a surface of the solar cell string; and a cover plate configured to cover a surface of the encapsulation layer away from the solar cell string.

\* \* \* \* \*